(12) United States Patent
Birru

(10) Patent No.: US 6,215,343 B1
(45) Date of Patent: Apr. 10, 2001

(54) DELAY LOCKED LOOP

(75) Inventor: Dagnachew Birru, Yorktown Heights, NY (US)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/365,462

(22) Filed: Aug. 2, 1999

(30) Foreign Application Priority Data

Aug. 4, 1998 (EP) .................................................. 98202628

(51) Int. Cl.$^7$ ....................................................... H03L 7/06
(52) U.S. Cl. ........................ 327/158; 327/161; 327/270; 327/271
(58) Field of Search .......................... 327/5, 7, 12, 158, 327/161, 270–271, 276, 149

(56) References Cited

U.S. PATENT DOCUMENTS

| 5,179,303 | 1/1993 | Searles et al. ........................ 307/603 |
| 5,663,665 | * 9/1997 | Wang et al. ............................. 327/3 |

FOREIGN PATENT DOCUMENTS

0609967A2  8/1994  (EP) .................................. G06F/1/10

* cited by examiner

*Primary Examiner*—Toan Tran
*Assistant Examiner*—Cassandra Cox

(74) *Attorney, Agent, or Firm*—Brian J. Wieghaus

(57) ABSTRACT

A delay locked loop comprising a chain (CHN) of at least two delay elements ($DL_1$–$DL_N$), of which a first delay element ($DL_1$) has an input for receiving a reference signal (phi0), and of which a last delay element ($DL_N$) has an output for delivering an output signal (phiN); a phase comparator (PHCMP) having a first input ($PH_1$) for receiving the reference signal (phi0), a second input ($PH_2$) for receiving the output signal (phiN), and an output for delivering a binary control signal ($B_{cntrl}$); and a converter (CNV) for converting the binary control signal ($B_{cntrl}$) into an analog control signal ($A_{cntrl}$) for controlling a delay time of at least one ($DL_1$–$DL_N$) of said delay elements ($DL_1$–$DL_N$). The phase comparator (PHCMP) comprises at least one additional input ($A_{ip}$) for receiving an output signal (phi1–phiN−1) of at least one of the delay elements ($DL_1$–$DL_{N-1}$) preceding the last delay element ($DL_N$). The state of the binary control ($B_{cntrl}$) signal supplied by the phase comparator (PHCMP) is not solely determined by the reference signal (phi0) and the output signal of the phase comparator (PHCMP), but also by the state of one or more output signals of the delay elements not being the first ($DL_1$) or the last ($DL_N$) delay element. Thus, the occurrences of subsequent active edges of the output signals of the delay elements ($DL_1$–$DL_N$) are registered. These occurrences are in fact the additional information needed by the delay locked loop in order to determine the appropriate binary control signal ($B_{cntrl}$) from which the analog control signal ($A_{cntrl}$) for controlling the delay time of the delay elements ($DL_1$–$DL_N$) is derived.

5 Claims, 7 Drawing Sheets

DELAY LOCKED LOOP

The invention relates to a delay locked loop comprising a chain of at least two delay elements, of which a first delay element has an input for receiving a reference signal, and of which a last delay element has an output for delivering an output signal; a phase comparator having a first input for receiving the reference signal, a second input for receiving the output signal, and an output for delivering a binary control signal; and a converter for converting the binary control signal into an analog control signal for controlling a delay time of at least one of said delay elements.

Such a delay locked loop is known from the general state of the art. A purpose of the known delay locked loop is to create multiple output signals taken from the outputs of the delay elements, which output signals have a well-defined phase relationship with the reference signal. This well-defined phase relationship is accomplished that the phase comparator compares the phase of the output signal with the phase of the reference signal. The delay locked loop then controls the delay time of the delay elements in such a way that at the end the phase difference between the output signal and the reference signal substantially equals an integral multiple of 360 degrees.

A problem of the known delay locked loop is that it can easily happen that the delay locked loop locks at an undesired integral multiple of 360 degrees. Let it be assumed for example, that the desired phase difference between the output signal and the reference signal is 360 degrees (the multiple=1) and that for example, the desired phases of the output signals of the delay elements are 90 degrees, 180 degrees, and 270 degrees, respectively. If, however, the delay locked loop locks at a wrong integral multiple of 360 degrees, for example 720 degrees (the multiple=2), the afore-mentioned phases of the output signals of the delay elements are 180 degrees, 360 degrees, and 540 degrees, respectively which are not the desired phases.

It is an object of the invention to provide an improved delay locked loop which eliminates the above-mentioned disadvantage.

To this end, according to the invention, the delay locked loop of the type defined in the opening paragraph is characterized in that the phase comparator comprises at least one additional input for receiving an output signal of at least one of the delay elements preceding the last delay element.

The invention is based on the insight that the problem of the known delay locked loop is caused by the fact that the phase comparator only receives information from the reference signal and the output signal and does not receive additional information from one or more of the output signals of the delay elements not being the last delay element. Since the phase comparator of the delay locked loop according to the invention does receive additional information from one or more of the output signals of the delay elements not being the last delay element, it has become possible for the delay locked loop to lock in order to obtain the appropriate integral multiple of 360 degrees.

The delay locked loop is further characterized in that the phase comparator comprises a first basic flip-flop having a clock input coupled to the first input of the phase comparator, a data input, an output, and a reset input; a second basic flip-flop having a clock input coupled to the second input of the phase comparator, a data input, an output, and a reset input; an initialization flip-flop having a clock input coupled to the first input of the phase comparator, a data input for receiving a fixed data input state, an output coupled to the data input of the first basic flip-flop, and a reset input; a chain of flip-flops in which each flip-flop has a clock input forming the at least one additional input, which is coupled to an output of a corresponding delay element, an output, a data input coupled to the output of the preceding flip-flop, except for the data input of the first flip-flop, which data input is coupled to the output of the initialization flip-flop, and a reset input, and in which the output of the last flip-flop is coupled to the data input of the second basic flip-flop; and resetting means for supplying under command of signals on the outputs of the first and the second basic flip-flop, at least one reset signal to the reset inputs of the first and the second basic flip-flop, to the initialization flip-flop, and to the chain of flip-flops.

In this embodiment of the invention the state of the delay locked loop is initialized during a clock cycle of the reference signal by applying a reset signal to the reset inputs of the initialization flip-flop, the first and the second basic flip-flops, and the chain of flip-flops.

The state of the binary control signal delivered by the phase comparator is not solely determined by the reference signal and the output signal of the phase comparator, but also by the state of one or more output signals of the chain of flip-flops. This is accomplished by coupling the clock inputs of the chain of flip-flops to the outputs of corresponding delay elements. Thus the occurrences of subsequent active edges of the output signals of the delay elements are registered in the chain of flip-flops. These occurrences are in fact the additional information needed by the delay locked loop in order to determine the appropriate binary control signal from which the analog control signal for controlling the delay time of the delay elements is derived.

The delay locked loop is further characterized in that the number of flip-flops in the chain of flip-flops is equal to the number of delay elements minus one. Thus the above-mentioned occurrences of all the output signals of the delay elements are registered in the chain of flip-flops. This provides maximum robustness (i.e. reliability of the desired operation).

The required number of occurrences to be registered may be compromised with the potential robustness. This requires a trade-off with the number of required flip-flops in the chain of flip-flops.

The delay locked loop is further characterized in that the chain of flip-flops has been replaced by a single flip-flop. The advantage of this is that the required number of flip-flops, and thus the required chip-area when the invention is used in an integrated circuit, is hardly larger than in the case of a delay locked loop according to the prior art, while the robustness is still improved.

The invention will be described in more detail with reference to the accompanying drawings, in which.

In these Figures parts or elements having like functions or purposes bear the same reference symbols.

Figure 1:
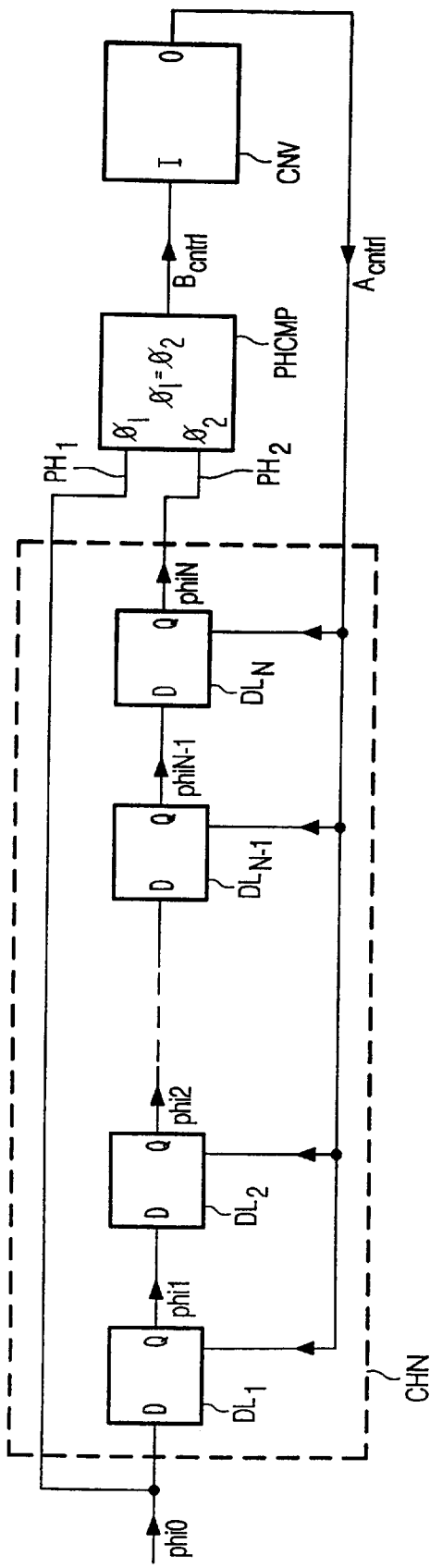
FIG. 1 is circuit diagram of a known delay locked loop.

FIG. 1 shows a circuit diagram of a known delay locked loop comprising a number of N delay elements $DL_1$–$DL_N$, a phase comparator PHCMP, and a converter CNV. An input of the first delay element $DL_1$ receives a reference signal phi0. The reference signal phi0 is also available at a first input $PH_1$ of the phase comparator PHCMP. An output of the last delay element $DL_N$ delivers an output signal phiN to a second input $PH_2$ of the phase comparator PHCMP. The phase comparator PHCMP delivers a binary control signal $B_{cntrl}$ which is dependent on the phase difference between the reference signal phi0 and the output signal phiN. The converter CNV converts the binary control signal $B_{cntrl}$ into an analog control signal $A_{cntrl}$ for controlling a delay time of at least one delay element $DL_1$–$DL_N$.

Figure 2:
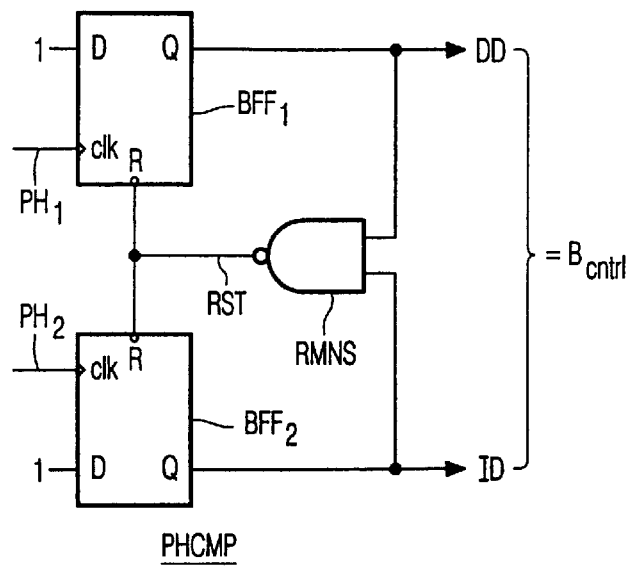
FIG. 2 is a circuit diagram of a known phase comparator for use in the known delay locked loop.

FIG. 2 is a circuit diagram of the known phase comparator PHCMP. The phase comparator PHCMP comprises a first basic flip-flop $BFF_1$ having a clock input which forms the first input $PH_1$ of the phase comparator PHCMP, a data input, an output, and a reset input; and a second basic flip-flop $BFF_2$ having a clock input, which forms the second input of the phase comparator PHCMP, a data input, an output, and a reset input. The phase comparator PHCMP also comprises resetting means RMNS, which by way of example is formed by a nand-gate which has a first input connected to the output of the first basic flip-flop $BFF_1$, and a second input connected to the output of the second basic flip-flop $BFF_2$. The output of the nand-gate is connected to the reset inputs of the first and the second basic flip-flop $BFF_1$, $BFF_2$. The output signals DD and ID which are delivered by the outputs of the first and the second basic flip-flops $BFF_1$, $BFF_2$, in fact together form the binary control signal $B_{cntrl}$. By way of example the data inputs of the first and the second basic flip-flops $BFF_1$, $BFF_2$ receive a logical "1". In the present example, resetting occurs on the negative edge of the reset signal RST delivered by the nand-gate. Also by way of example, the first and the second basic flip-flops $BFF_1$, $BFF_2$ are so called positive edge triggered flip-flops. By way of example it is assumed that the analog control signal $A_{cntrl}$ reduces the delay time of the chain CHN if the output signal DD (DD is considered an abbreviation for "Decrease Delay") is logical "1" while the output signal ID (ID is considered an abbreviation for "Increase Delay") is logical "0". Similarly, the analog control signal $A_{cntrl}$ increases the delay time of the chain CHN if the output signal ID is logical "1" while the output signal DD is logical "0". In the situation that the output signals DD and ID are both logical "1" or logical "0", the analog control signal $A_{cntrl}$ does not change the delay time of the chain CHN.

For a better understanding of the invention firstly the normal operation of the known delay locked loop will be explained in conjunction with the signal diagrams I–IX of FIG. 5, and secondly a problem of the known delay locked loop will be explained in conjunction with the signal diagrams I–IX of FIG. 6.

Figure 5:
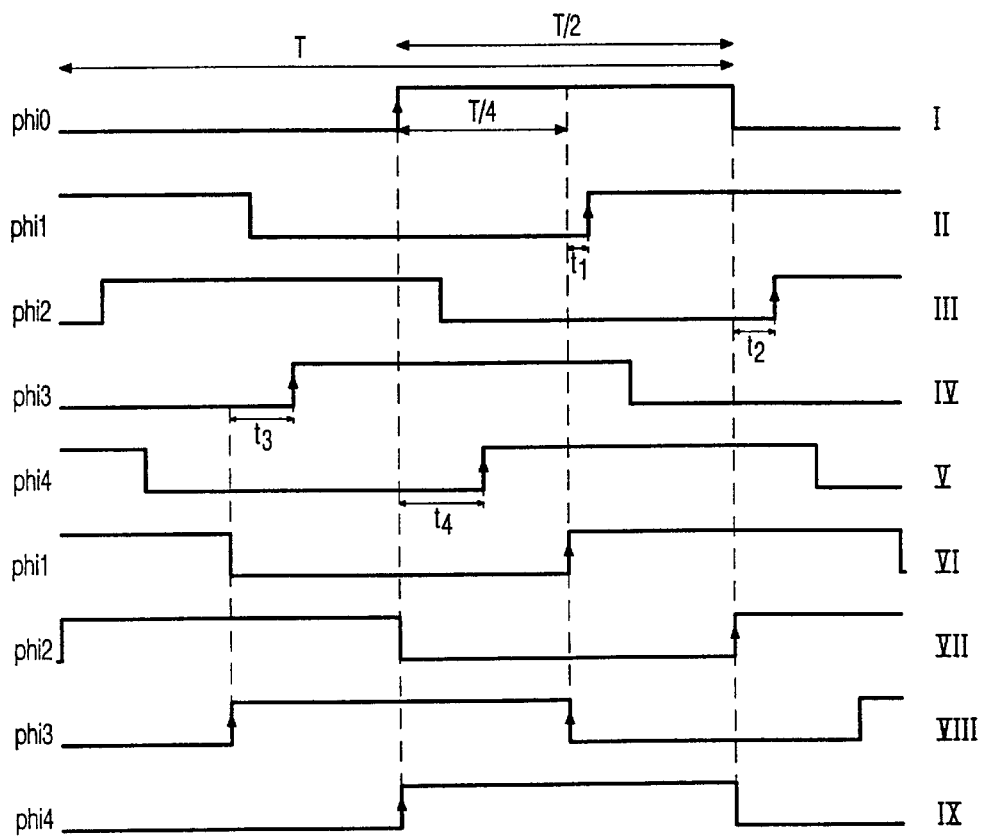
FIGS. 5 and 6 are signal diagrams for explaining the normal operation and a problem of the known delay locked loop.

In FIG. 5 diagram I shows the reference signal phi0. The repetition period of the reference signal phi0 is referenced T. By way of example, the number N of delay elements $DL_N$ is chosen to be four. Also by way of example, it is assumed that the delay elements $DL_1$–$DL_4$ are identical. Therefore, the signals phi1–phi4 represent the output signals of the delay elements $DL_1$–$DL_4$, respectively. In this example the output signals phi1, phi2, and phi3 should have a phase delay with respect to the reference signal of 90 degrees, 180 degrees, and 270 degrees, respectively. However, shortly after the delay locked loop has been turned on the output signals phi1, phi2, and phi3 do not have the required phases.

The output signal phi1 should be 90 degrees delayed with respect to the reference signal phi0, i.e. the time difference of the positive edges, as indicated by vertical arrows in FIG. 5, should be T/4 (a quarter of the time of the repetition period T). However, as is shown in diagram II, the delay of the first delay element $DL_1$ is exceeded by an amount of time $t_1$ as indicated in diagram II. In the same way the delays of the second until the fourth delay elements $DL_2$–$DL_4$ are exceeded by amounts of time $t_2$–$t_4$, respectively as indicated in diagrams III–V. The delay locked loop will adapt the analog control signal $A_{cntrl}$ in order to bring the fourth output signal phi4 in phase with the reference signal phi0. Therefore, $t_4$ will be substantially equal to zero after the delay locked loop has reached a steady state. Since the analog control signal $A_{cntrl}$ controls all the identical delay elements $DL_1$–$DL_4$, $t_1$, $t_2$, and $t_3$ will then also be zero. Therefore, the output signals phi1–phi3 will have the required phases (90 degrees, 180 degrees, and 270 degrees respectively) as indicated in diagrams VI–IX. So far, the operation of the known delay locked loop seems to be correct. However, a problem with the known delay locked loop is that the operation can easily turn out to be incorrect if the initial states of the output signals phi1–phi4 are different just after the known delay locked loop has been switched on. To demonstrate this problem, reference is made to the diagrams I–IX of FIG. 6. It is now assumed that the delays of the first to the fourth delay elements $DL_1$–$DL_4$ are exceeded by amounts of time of $t_1+T/4$, $t_2+T/2$, $t_3+3*T/4$, and $t_4+T$, respectively. In order to obtain the correct output signals phi1–phi3 when the delay locked loop has reached a steady state, the delay locked loop has to adapt the analog control signal $A_{cntrl}$ in order to reduce the delay of the output signal phi4 by an amount of time $t_4+T$. However, the delay locked loop will already stop adapting the analog control signal $A_{cntrl}$ after the delay time of the output signal phi4 has been reduced by the amount $t_4$, because then the output signal phi4 is in phase with the reference signal phi0. This means that the delay locked loop locks at a wrong integral multiple of 360 degrees, which is caused by the fact that the delay locked loop cannot differentiate between the amount of time $t_4$ and the amount of time $t_4+T$. In other words, the delay locked loop "thinks" that the excess delay to be reduced is $t_4$ while it should be $t_4+T$. As a consequence, after the delay locked loop has reached a steady state, the phases of the output signals phi1–phi3 of the delay elements $DL_1$–$DL_3$ are 180 degrees, 0 degrees, and 180 degrees, respectively (as indicated in diagrams VI–VIII) with respect to the reference signal phi0, which are completely different from the desired phases: 90 degrees, 180 degrees, and 270 degrees respectively. In other words the known delay locked loop malfunctions, for example under the circumstances just described for the initial states of the delay elements $DL_1$–$DL_4$.

Figure 3:
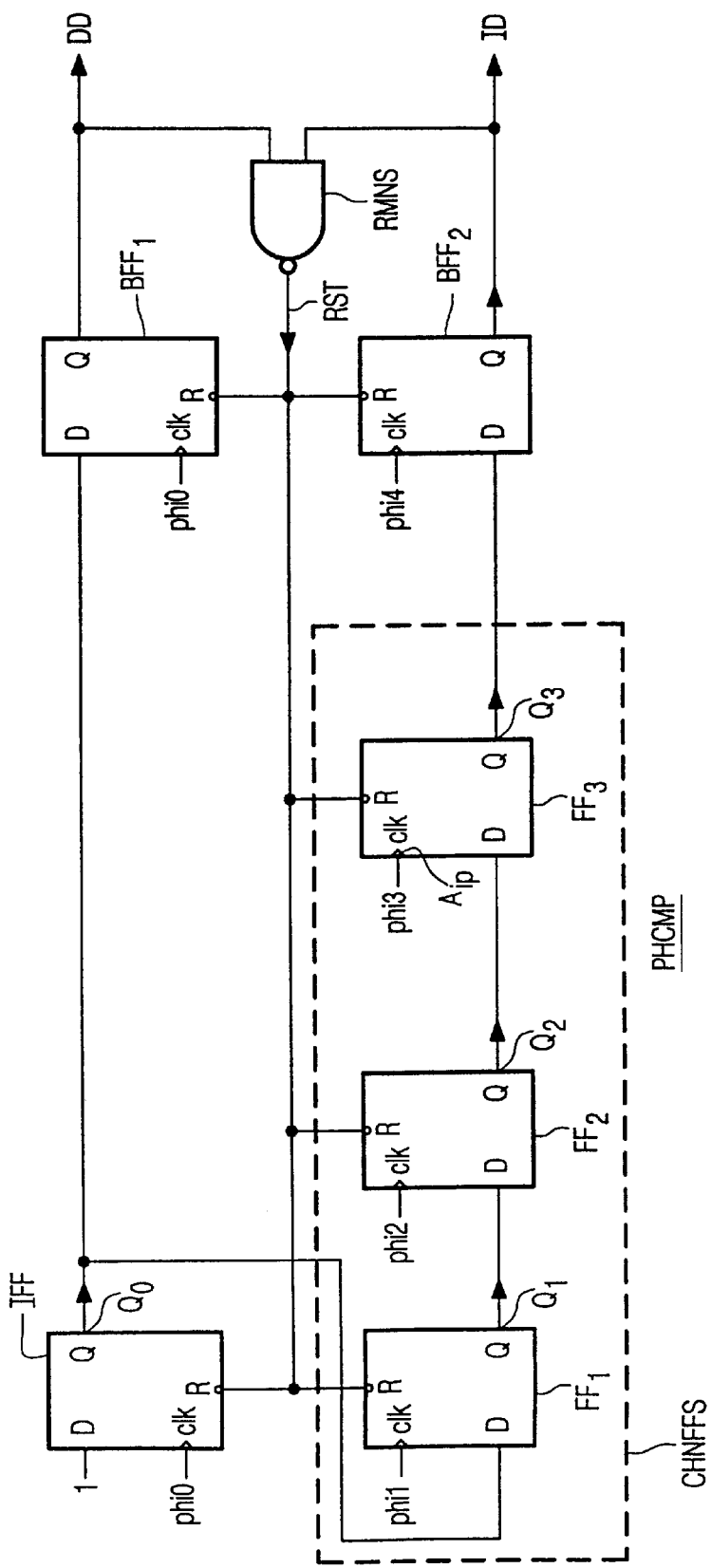
FIG. 3 is an example of a novel phase comparator suitable for use in a delay locked loop according to the invention.

FIG. 3 shows a novel phase comparator PHCMP which is suitable for use in a delay locked loop so as to form a novel delay locked loop which eliminates the aforementioned disadvantage of the known delay locked loop. For this reason the phase comparator PHCMP as shown in FIG. 2 is supplemented with an initialization flip-flop IFF having a clock input connected to the first input $PH_1$ of the phase comparator PHCMP, a data input, an output $Q_0$ connected to the data input of the first basic flip-flop $BFF_1$, and a reset input connected to the output of the nand-gate. The phase comparator PHCMP further comprises a chain CHNFFS of four flip-flops $FF_1$–$FF_3$. The flip-flops $FF_1$–$FF_3$ each have a clock input forming an at least one additional input $A_{ip}$, which is connected to an output of a corresponding delay element $DL_1$–$DL_3$. (See also FIG. 1.) The respective data inputs of the flip-flops $FF_2$–$FF_3$ are connected to the respective outputs of the preceding flip-flops $FF_1$–$FF_2$. The data input of the first flip-flop $FF_1$ is connected to the output $Q_0$ of the initialization flip-flop IFF. The output of the last flip-flop $FF_3$ is connected to the data input of the second basic flip-flop $BFF_2$. The reset inputs of the basic flip-flops $BFF_1$–$BFF_2$, the initialization flip-flop IFF, and of the flip-flops $FF_1$–$FF_3$ of the chain CHNFFS are connected to each other.

Figure 7:
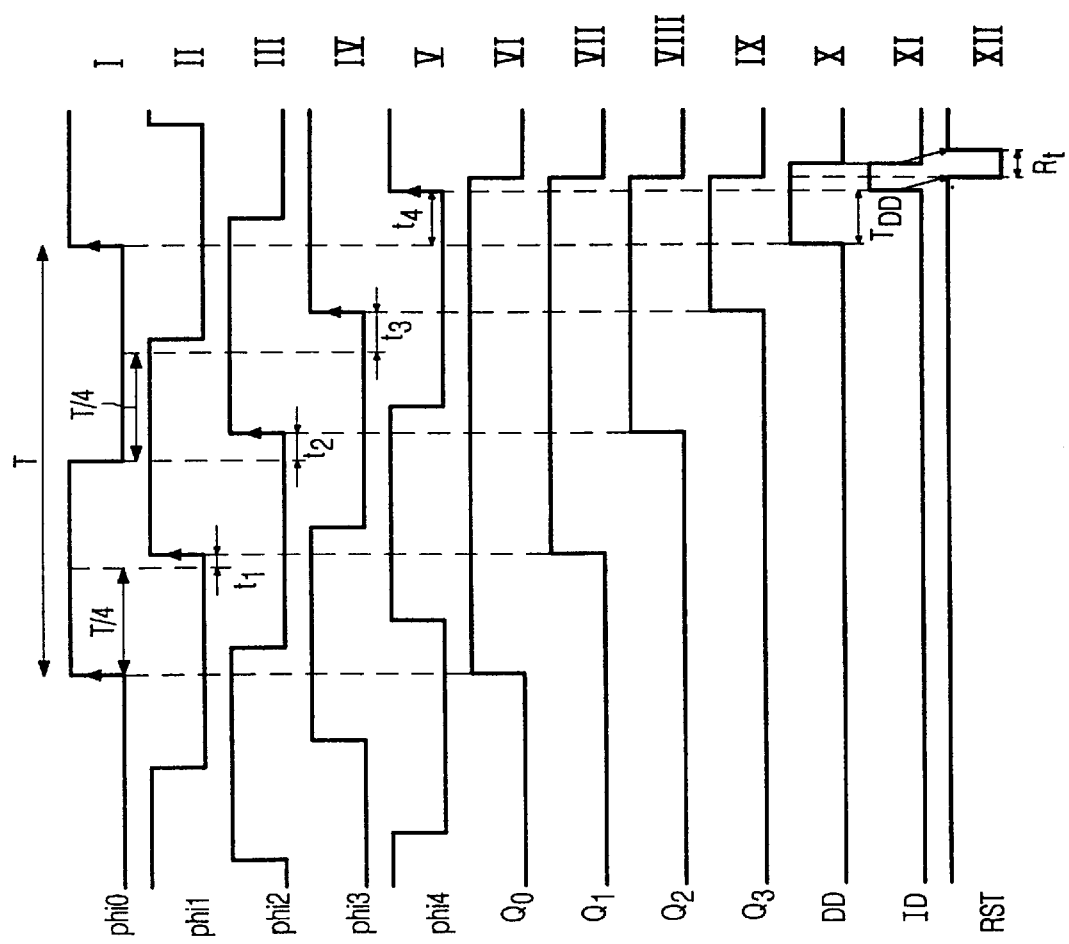
FIGS. 7 and 8 are signal diagrams for explaining the operation of embodiments of a delay locked loop according to the invention.
Figure 8:
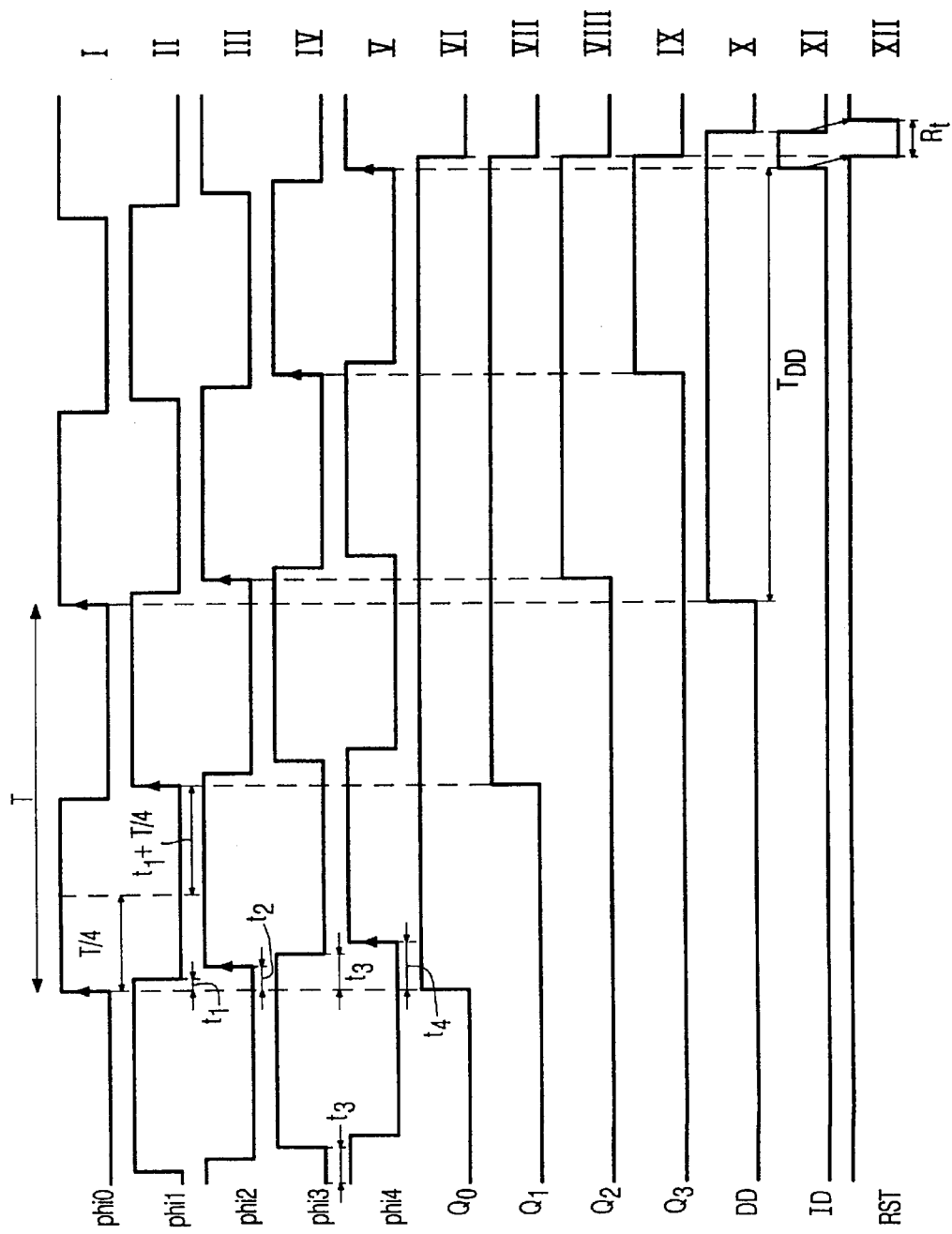

The principle of operation of the novel delay locked loop will be explained in conjunction with diagrams I–XII of FIG. 7 and with diagrams I–XII of FIG. 8. In FIGS. 7 and 8 it has been assumed that the delay locked loop is reset by a negative edge of the reset signal RST.

In FIG. 7 the reference signal phi0 and the output signals phi1–phi4 as indicated in diagrams I–V correspond to those in diagrams I–V of FIG. 5. The data input of the initialization flip-flop IFF receives a fixed data input state. In the present example (see FIG. 3) the fixed data input state is a logical "1". Diagrams I and VI of FIG. 7 show that the output signal $Q_0$ changes from logical "0" to logical "1" when, after resetting of the delay locked loop, the first positive edge of the reference signal phi0 occurs. Since the data input of the initialization flip-flop IFF receives the fixed logical "1" the output signal $Q_0$ will remain logical "1", at least until a following reset occurs. As a consequence, the output signal DD of the output of the first basic flip-flop $BFF_1$ changes from logical "0" to logical "1" when the second positive edge of the reference signal phi0 occurs, see diagram X. The data input of the first flip-flop $FF_1$ of the chain CHNFFS is also logical "1" from the instant of the first positive edge of the reference signal phi0. However, the output signal $Q_1$ of flip-flop $FF_1$ does not change from logical "0" to logical "1" on the first positive edge of the reference signal phi0 because on that instant the output signal phi1 is logical "0". The output signal $Q_1$ changes from logical "0" to logical "1" on the first positive edge of the output signal phi1 after the first positive edge of the reference signal phi0. In a similar way the output signal $Q_2$ changes from logical "0" to logical "1" on the first positive edge of the output signal phi2 after the first positive edge of the output signal phi1, and the output signal $Q_3$ changes from logical "0" to logical "1" on the first positive edge of the output signal phi3 after the first positive edge of the output signal phi2. The output signal ID of the output of the second basic flip-flop $BFF_2$ changes from logical "0" to logical "1" on the first positive edge of the output signal phi4 after the first positive edge of output signal phi3. At this instant both output signals DD and ID have become logical "1" and, as a consequence, the output of the nand-gate changes from logical "1" to logical "0" and the reset signal RST resets the first and the second basic flip-flop $BFF_1$ –$BFF_2$, the initialization flip-flop IFF, and the chain of flip-flops CHNFFS. In response to the reset signal RST the output signals DD and ID becomes logical "0" and, as a consequence, the reset signal RST becomes logical "1" again. Thus the reset signal RST is only logical "0" for a short time referenced "$R_t$" in diagram XII. During the time, referenced "$T_{DD}$", that the output signal DD is logical "1" while the output signal ID is logical "0", the analog control signal $A_{cntrl}$ controls the chain CHN of delay elements $DL_1$–$DL_4$ (see FIG. 1; N=4) in order to reduce the delay of the chain CHN.

Figure 6:
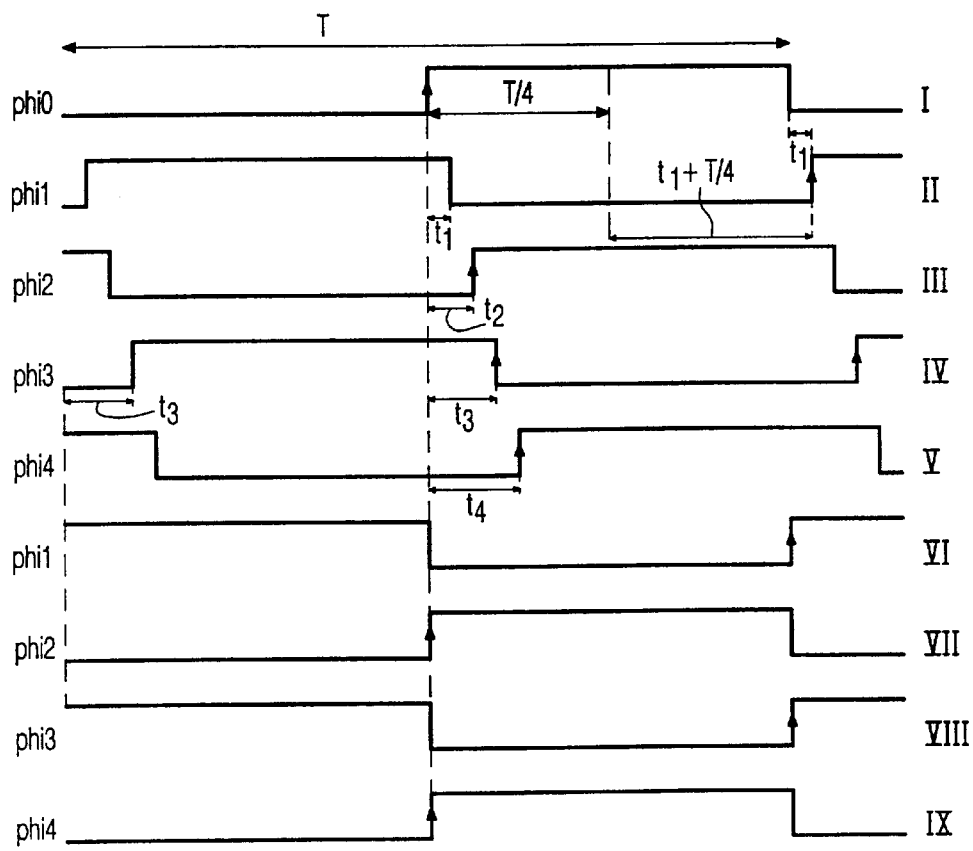

In FIG. 8 the reference signal phi0 and the output signals phi1–phi4 as indicated in diagrams I–V correspond to those in diagrams I–V of FIG. 6. From the reference signal phi0 and the output signals phi1–phi4 the signals $Q_0$–$Q_3$, DD, ID, and RST are derived (see diagrams VI–XII) in a similar way as described in conjunction with FIG. 7. An important difference of FIG. 7 is that the amount of time $T_{DD}$ is much larger. This is caused by the much larger delay in the output signals phi1–phi4 with respect to the reference signal phi0 as compared with the situation of FIG. 7. As a consequence, the delay locked loop will adapt the analog control signal $A_{cntrl}$ in order to reduce the delay of the output signal phi4 by an amount of time $t_4$+T. Thus, the delay locked loop will not stop adapting the analog control signal $A_{cntrl}$ after the delay time of the output signal phi4 has been reduced by the amount $t_4$. This means that the delay locked loop locks at the correct integral multiple of 360 degrees, which is because the delay locked loop can now differentiate between the time amount $t_4$ and the time amount $t_4$+T through the different amount of time $T_{DD}$. As a consequence, after the delay locked loop has reached the steady state, the output signals phi1–phi3 of the delay elements $DL_1$–$DL_3$ have the desired phases: 90 degrees, 180 degrees, and 270 degrees, respectively. For other initial delays of the output signals phi1–phi3 the delay locked loop according to the invention will also generate the correct output signals phi1–phi3 after the delay locked loop has reached a steady state. If, for example, the initial delays of the output signals phi1–phi3 of the delay locked loop are such that the known delay locked loop would lock at the wrong integral multiple of 360 degrees, for example an integral multiple equal to three, the delay locked loop according to the invention will generate an even longer time $T_{DD}$ as compared with the case of FIG. 8, and will thus lock at the desired integral multiple of 360 degrees, so that in this case the integral multiple is one.

Figure 4:
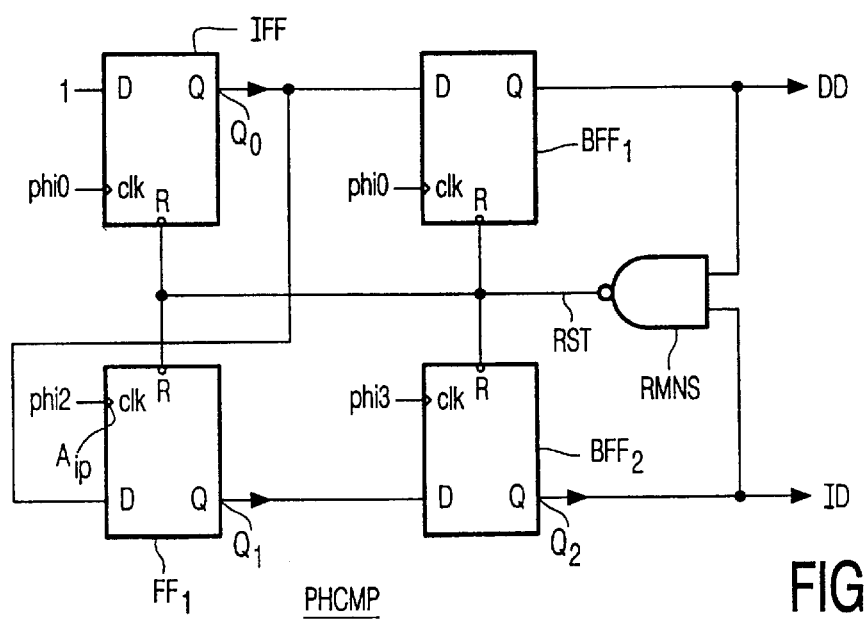
FIG. 4 is another example of a novel phase comparator suitable for use in a delay locked loop according to the invention.

FIG. 4 shows a more economical version of the phase comparator PHCMP to be used in a so called four-phase (phi0–phi3) delay locked loop. The chain of flip-flops CHNFFS (see FIG. 3) is replaced by a single Flip-Flop $FF_1$. Even in this case not all active edges of the output signals phi1–phi3 are registered (in FIG. 4 the output signal phi1 is not used) a comparatively reliable delay locked loop is obtained with the additional advantage of a small number of flip-flops.

The analog control signal $A_{cntrl}$ may be a voltage or a current which controls the delay times of the delay elements $DL_1$–$DL_N$. FIG. 1 shows that all the delay elements $DL_1$–$DL_N$ are controlled by a single analog control signal $A_{cntrl}$. This is, however, not strictly necessary. It is, for example, also possible that the converter CNV supplies several analog control signals for separately controlling the delay times of the delay elements $DL_1$–$DL_N$. For some applications it might be sufficient to control only some of the delay times of the delay elements $DL_1$–$DL_N$.

What is claimed is:

1. A delay locked loop comprising a chain of at least two delay elements, of which a first delay element has an input for receiving a reference signal, and of which a last delay element has an output for delivering an output signal; a phase comparator having a first input for receiving the reference signal, a second input for receiving the output signal, and an output for delivering a binary control signal; and a converter for converting the binary control signal into an analog control signal for controlling a delay time of at least one of said delay elements, characterized in that the phase comparator comprises at least one additional input for receiving an output signal of at least one of the delay elements preceding the last delay element, and the phase comparator comprises a first basic flip-flop having a clock input coupled to the first input of the phase comparator, a data input, an output, and a reset input; a second basic flip-flop having a clock input coupled to the second input of the phase comparator, a data input, an output, and a reset input; an initialization flip-flop having a clock input coupled to the first input of the phase comparator, a data input for receiving a fixed data input state, an output coupled to the data input of the first basic flip-flop, and a reset input; a chain of flip-flops in which each flip-flop has a clock input forming the at least one additional input, which is coupled to an output of a corresponding delay element, an output, a data input coupled to the output of the preceding flip-flop, except for the data input of the first flip-flop, the data input of the first flip-flop being coupled to the output of the initialization flip-flop, and a reset input, and in which the output of the last flip-flop is coupled to the data input of the second basic flip-flop; and resetting means for supplying under command of signals on the outputs of the first and second basic flip-flops, at least one reset signal to the reset inputs of the first and the second basic flip-flop, to the initialization flip-flop, and to the chain of flip-flops.

2. A delay locked loop as claimed in claim 1, characterized in that the number of flip-flops in the chain of flip-flops is equal to the number of delay elements minus one.

3. A delay locked loop as claimed in claim 1, characterized in that the chain of flip-flops has been replaced by a single flip-flop.

4. A delay locked loop comprising:
   a plurality of delay elements that is configured to receive a reference signal and to produce a delayed signal having a delay relative to the reference signal,
   a phase comparator that is configured to compare the reference signal to the delayed signal and to produce a feedback signal that facilitates an adjustment to the delay of the delayed signal relative to the reference signal,
wherein:
the phase comparator includes:
   a first flip-flop that is clocked by the reference signal, and
   a second flip-flop that is clocked by the delayed signal, that includes:
      an input that is based on at least one intermediate output of the plurality of delay elements that does not correspond to the delayed signal, and
the feedback signal is dependent upon outputs of the first and second flip-flops.

5. The delay locked loop of claim 4, further including
   a third flip-flop that is also clocked by the reference signal, and
   a plurality of other flip-flops, each clocked by a corresponding intermediate output of the plurality of delay elements, and
wherein
   an input to the first flip-flop is provided by an output of the third flip-flop, and
   the input to the second flip-flop is provided by at least one output of the plurality of other flip-flops.

* * * * *